(12) United States Patent
Brownfield et al.

(10) Patent No.: US 6,333,253 B1
(45) Date of Patent: Dec. 25, 2001

(54) PATTERN-BLOCK FLUX DEPOSITION

(75) Inventors: Terri J. Brownfield, Boulder Creek; Raj N. Master, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/696,049

(22) Filed: Oct. 26, 2000

Related U.S. Application Data
(60) Provisional application No. 60/227,286, filed on Aug. 24, 2000.

(51) Int. Cl.[7] .................................................. H01L 21/44
(52) U.S. Cl. ............................................. 438/612; 438/106
(58) Field of Search ................................... 438/106, 108, 438/118, 125, 612, 154, 162, 226, 295, 325; 228/6.2, 7, 47, 102

(56) References Cited

U.S. PATENT DOCUMENTS

| | | | |
|---|---|---|---|
| 4,151,945 | * | 5/1979 | Regard et al. ............................ 228/6 |
| 5,482,736 | * | 1/1996 | Glenn et al. ............................ 427/96 |
| 5,629,241 | * | 5/1997 | Matloubian et al. ................. 438/125 |
| 5,904,510 | * | 5/1999 | Merril et al. .......................... 438/154 |
| 6,103,549 | * | 8/2000 | Master et al. ......................... 438/106 |

* cited by examiner

*Primary Examiner*—David Nelms
*Assistant Examiner*—Phuc T. Dang

(57) ABSTRACT

A method and apparatus are provided for selectively depositing flux on a plurality of flip-chip bumps arranged on a semiconductor by mounting a flux stamp on the semiconductor chip. The flux stamp has a plurality of flux holes arranged in a pattern substantially identically corresponding to the arrangement of the flip-chip bumps of the semiconductor chip. Different flux stamps are prepared for various kinds of semiconductor chips having different flip-chip bump arrangements. Flux is deposited though the flux holes of the flux stamp which selectively exposing the upper surfaces of the flip-chip bumps of the chip, thereby leaving no flux on the chip surface between the flip-chip bumps.

10 Claims, 4 Drawing Sheets

PATTERN-BLOCK FLUX DEPOSITION

RELATED APPLICATIONS

This application claims priority from U.S. Provisional Application Ser. No. 60/227,286, filed Aug. 24, 2000, incorporated herein by reference.

FIELD OF THE INVENTION

The present invention relates to semiconductor assembly technology, and more particularly to flip-chip interconnections between a semiconductor chip and a substrate.

BACKGROUND OF THE INVENTION

A common task in the manufacture of microelectronic components involves the manufacture of single chip or multi-chip modules having input/output pins which are inserted into a substrate. The input/output pins provide the needed electrical connections to the integrated circuit chips which are subsequently connected to the substrate or carrier. In other presently known manufacturing processes, a chip is soldered directly to a printed circuit board. With either process, solder flux compositions have typically been applied to the pins in order to connect the component to the selected substrate, for instance, the printed circuit board.

As electronic devices become smaller and denser, greater demands are placed on the ability to establish efficient, reliable interconnections from a semiconductor chip to a substrate. There are three well-known methods for interconnecting chips to a substrate. The three methods are (a) face-up wire bonding, (b) face-up tape-automated bonding, and (c) the flip-chip method. Among these three methods, the flip-chip method has frequently been chosen as a preferred method of semiconductor packaging since it allows the interconnection of a high density device having a large number of input and output paths. Specifically, the flip-chip method is often preferred because it provides short conductivity leads from the chip to the substrate, a small device footprint, low inductance, high frequency capabilities, and good noise control.

As shown in FIG. 2, a flip-chip is a semiconductor chip 10 that is mounted onto a substrate 18 with the surface of the chip 10 facing the substrate 18. Although several materials may be used to form an interconnection between the flip-chip 10 and the substrate 18, solder is one of the more commonly employed materials for a flip-chip bump 12. In the solder interconnection process termed "controlled-collapse chip connection (C4)", the solder flip-chip bump 12 is deposited on a conductive terminal on the semiconductor chip 10. Then the semiconductor chip 10 is aligned with the substrate 18 so that the solder flip-chip bump 12 is directly over a flip-chip pad 20 of the substrate 18. The flip-chip bump 12 is then tacked to the substrate 18 and reflowed in the presence of flux, creating an electrical and mechanical connection from the chip 10 to the substrate 18 as well as a path for heat dissipation.

Typically, the chip-substrate joining process involves application of flux on the chip 10 and/or the flip-chip pads 20 of the substrate 18. As shown in FIG. 1, flux 16 is sprayed over the entire surface of the semiconductor chip 10 by a jet sprayer 14, including the previously formed flip-chip bumps 12. Then, the chip 10 is aligned to the substrate 18 having flip-chip pads 20 on its surface, which is further facilitated by the flux viscosity and tackiness. The chip-substrate assembly is then subjected to solder reflow in a furnace under nitrogen or forming gas. In the subsequent cooling cycle of the thermal profile for joining, the solder hardens and at the same time, the residual flux vapors deposit on the various exposed surfaces. Under the high temperature solder reflow environment, the flux is mostly removed by thermal decomposition to volatile species. However, a small fraction of these thermally activated species undergoes cross-linking reactions, resulting in resinous/carbonaceous byproducts as residue 22 (FIG. 2) on the C4 connections and all of the other surfaces on the chip 10 and the substrate 18 that are exposed to the volatile species during the solder reflow professing. The flux residue 22 must be removed from all critical surfaces prior to further operation, otherwise it can lead to function failure during long term use due to stress corrosion during exposure to temperature and humidity conditions. Further need for removal of flux residue is dictated by the observation that if any residual film of flux residue remains on the substrate or device surface material, it cause detriment to the adhesion of C4 epoxy encapsulant or underfill which is required for enhanced C4 fatigue life and C4 reliability during production on-off cycles.

Therefore, there exists a need for improved and production worthy methodology which removes flux residue from all critical surfaces.

SUMMARY OF THE INVENTION

These and other needs are met by the present invention which provides a method of selectively depositing flux on a plurality of flip-chip bumps to reduce flux residue from critical areas of the chip surface and an apparatus for the same purpose.

In accordance with the method of the present invention, the semiconductor chip is masked to selectively expose the plurality of flip-chip bumps. Flux is selectively deposited on the exposed plurality of flip-chip bumps. In certain embodiment of the present invention, the semiconductor chip is masked by positioning a flux stamp, which has a plurality of flux holes arranged so as to selectively expose the plurality of flip-chip bumps, on the surface of the semiconductor chip. Flux is then jet sprayed or manually brushed on the plurality of flip-chip bumps through the plurality of flux holes.

The apparatus in accordance with the present invention, comprises a flux stamp masking the surface of the semiconductor chip to selectively expose the plurality of flip-chip bumps, and a fluxer depositing flux on the exposed plurality of flip-chip bumps. In certain embodiments of the present invention, the flux stamp includes a plurality of flux holes arranged in a pattern identically corresponding to an arrangement pattern of the plurality of flip-chip bumps. A fluxer is also provided to deposit flux on the plurality of flip-chip bumps through the plurality of flux holes of the flux stamp.

Hence, flux is selectively deposited on the flip-chip bumps. This has an advantage of reducing flux residue remaining on the surface of both chip and substrate, thereby reducing the risk of the device's functional failure during long term use due to stress corrosion caused by exposure to temperature and humidity, thus achieving enhanced C4 fatigue life and C4 reliability during production on-off cycle. This invention has an advantage that the flux stamp can be easily incorporated to the conventional flux deposition process. Further the flux stamp can be prepared at a relatively inexpensive price without involving a complicated manufacturing process.

Additional advantages of the present invention will become readily apparent to those skilled in the art from the following detailed description, wherein only the preferred embodiment of the present invention is shown and described, simply by way of illustration of the best mode contemplated for carrying out the present invention. As will be realized, the invention is capable of other and different embodiments and its several details are capable of modifications in various obvious respects, all without departing from the present invention. Accordingly the drawings and description are to be regarded as illustrative in nature, and not as restrictive.

DETAILED DESCRIPTION OF THE EXEMPLARY EMBODIMENTS

The method and apparatus described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-section portions of a semiconductor chip or a substrate during fabrication are not drawn to scale, but instead are drawn to illustrate the feature of the present invention.

In accordance with certain embodiments of the present invention, methods are provided that substantially reduce flux residue on the substrate of a semiconductor chip or a substrate. As part of the invention, it was recognized that flux is normally deposited over the entire surface by jet spraying or brushing flux in accordance with conventional flux deposition process, which increases the risk of the device's functional failure and risks flip-chip interconnection device life and reliability. Thus, in accordance with the present invention, flux is selectively deposited on each flip-chip bumps by masking the semiconductor chip with a flux stamp which has a plurality of flux holes arranged in a flux pattern substantially identically corresponding to an arrangement pattern of the plurality of the flip-chip bumps. Since flux is selectively deposited only on each flip-chip bump and no flux is deposited directly to the surface of the chip or the substrate, the flux residue problem is significantly reduced.

Figure 1:
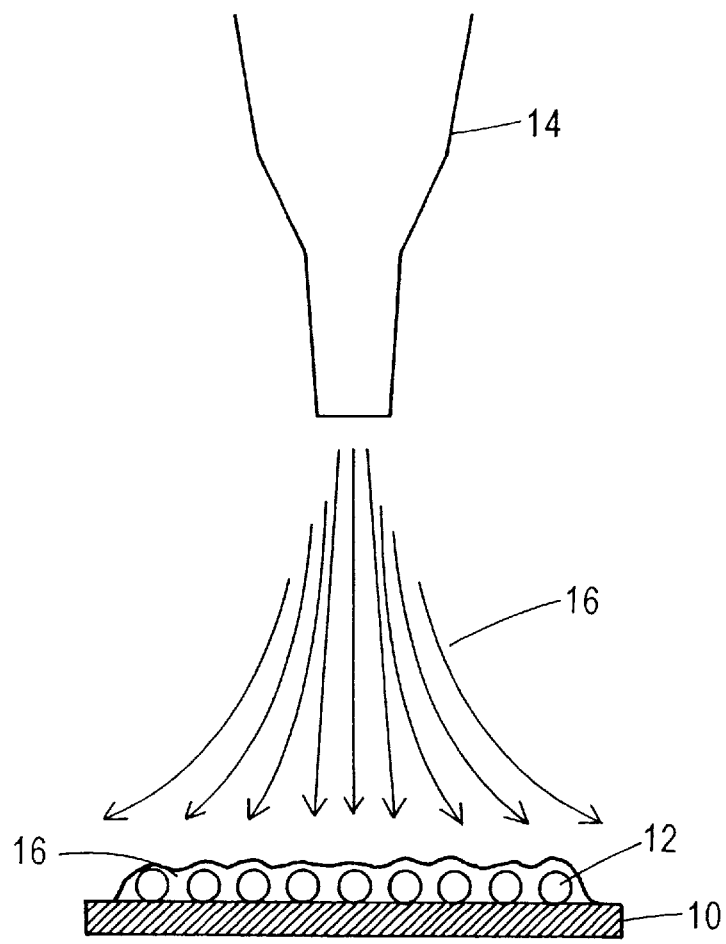
FIG. 1 depicts a prior art method of depositing flux on a semiconductor chip, in which flux is jet sprayed over the entire surface of the semiconductor chip.
Figure 2:
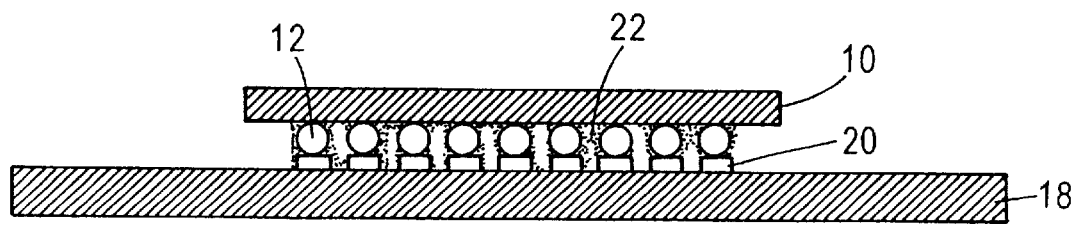
FIG. 2 depicts a cross-sectional view of a prior art flip-chip interconnection between a semiconductor chip and a substrate, in which flux residue remains on the surface of the chip and the substrate.
Figure 3:
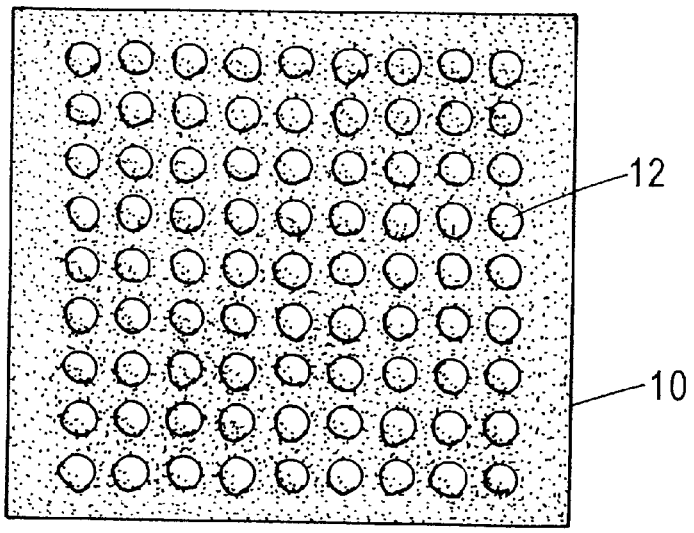
FIG. 3 depicts a top view of a semiconductor chip having a plurality of flip-chip bumps arranged on its surface.

With this in mind, FIG. 3 depicts a top view of a semiconductor chip 10 having a plurality of flip-chip bumps 12 arranged on its surface, in accordance with an exemplary embodiment of the present invention. The flip-chip bumps 12 are arranged in a matrix of 9 rows and 9 columns, as an example. In order to determine the precise arrangement pattern of the flip-chip bumps 12, it is necessary to determine the configuration of the flip-chip bumps 12, e.g., location of each flip-chip bump, bump diameter, distance between neighboring flip-chip bumps. However, the configuration of the flip-chip bumps 12 is easily acquirable from the design specification of the semiconductor chip 10.

Figure 4:
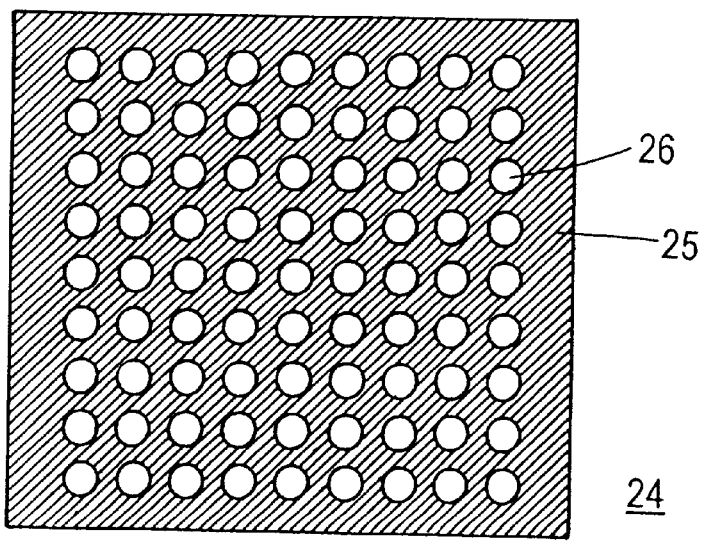
FIG. 4 depicts a top view of a flux stamp having a plurality of flux holes arranged in a pattern substantially identical to the arrangement pattern of the flip-chip bumps of the semiconductor chip of FIG. 3, in accordance with an embodiment of the present invention.

FIG. 4 depicts a top view of a flux stamp 24 manufactured based on the configuration of the flip-chip bumps 12. Since the flux deposition process is normally performed at a high temperature, heat-resistance materials, e.g., aluminum, are preferred in making the flux stamp 24. The flux stamp 24 comprises a mask portion 25 and a plurality of flux holes 26. The plurality of flux holes 26 are arranged substantially identically corresponding to the arrangement pattern of the flip-chip bumps 12. The flux stamp 24 can be manufactured by converting the configuration of the flip-chip bumps to computer-recognizable data format, e.g., binary data format, by a conventional computer system, and connecting the computer system to an automated punching system which punches a plain stamp to make the plurality of flux holes based on the converted configuration data. Also, the flux stamp 24 can be manufactured in a less complex way by simply marking the locations and diameter of each flip-chip bump 12 on a plain stamp and then manually punching the plain stamp.

Figure 5:
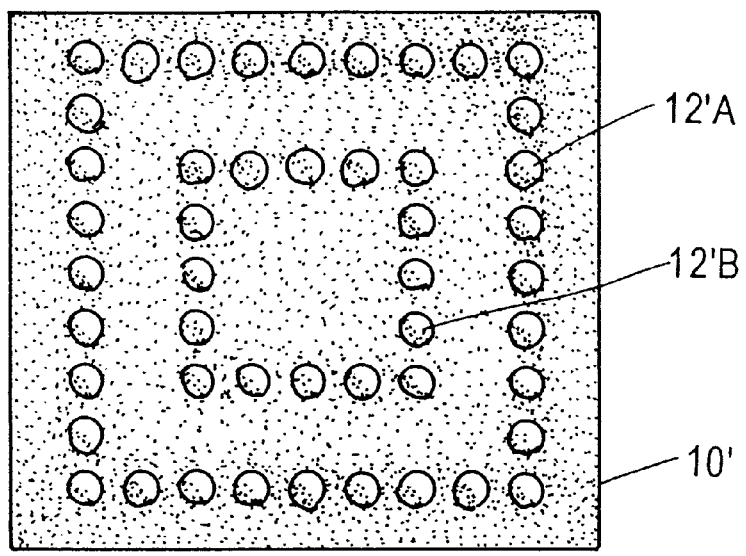
FIG. 5 depicts a top view of a semiconductor chip having a plurality of flip-chip bumps arranged on its surface.

FIG. 5 depicts a top view of another semiconductor chip 10' having a plurality of flip-chip bumps 12' arranged on its surface, in accordance with another exemplary embodiment of the present invention. Dissimilar to the arrangement pattern of the flip-chip bumps 12 in FIG. 3, the flip-chip bumps 12'A, 12'B are not arranged in a matrix. The flip-chip bumps 12'A arranged on the inner rectangular line are spaced apart from the flip-chip bumps 12'B arranged on the outer rectangular line, thereby exposing a substantial amount of the surface of the semiconductor chip.

Figure 6:
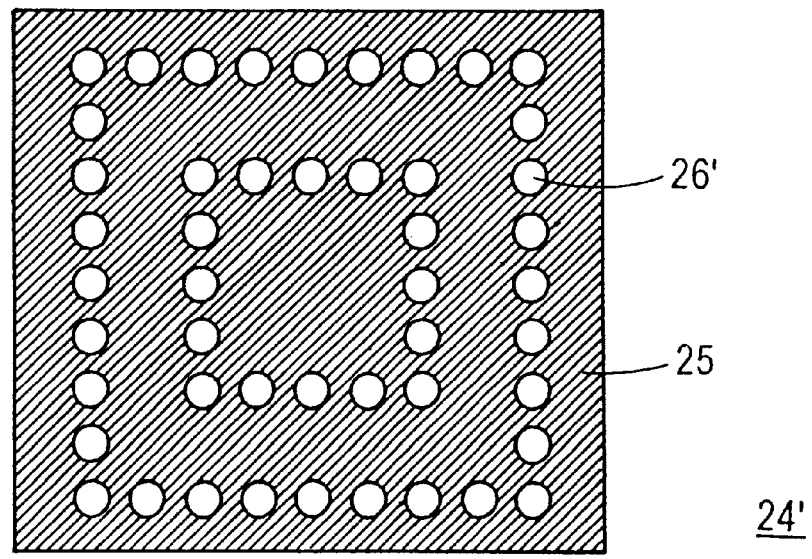
FIG. 6 depicts a top view of a flux stamp having a plurality of flux holes arranged in a pattern substantially identical to the arrangement pattern of the flip-chip bumps of the semiconductor chip of FIG. 5, in accordance with an embodiment of the present invention.

FIG. 6 depicts a top view of flux stamps 24' prepared based on the configuration of the flip-chip bumps 12'A and 12'B on the semiconductor chip 10' in FIG. 5. The flux stamp 24' comprises a mask portion 25 and a plurality of flux holes 26'. The plurality of flux holes 26' are arranged substantially identically corresponding to the arrangement pattern of the flip-chip bumps 12'A arranged on the inner rectangular line and the flip-chip bumps 12'B arranged on the outer rectangular line of the semiconductor chip 10'. Thus, in accordance with the present invention, based on the configuration of the flip-chip bumps of a semiconductor chip, different flux stamps having various flux hole patterns corresponding to the configuration of the flip-chip bumps are prepared.

Figure 7:
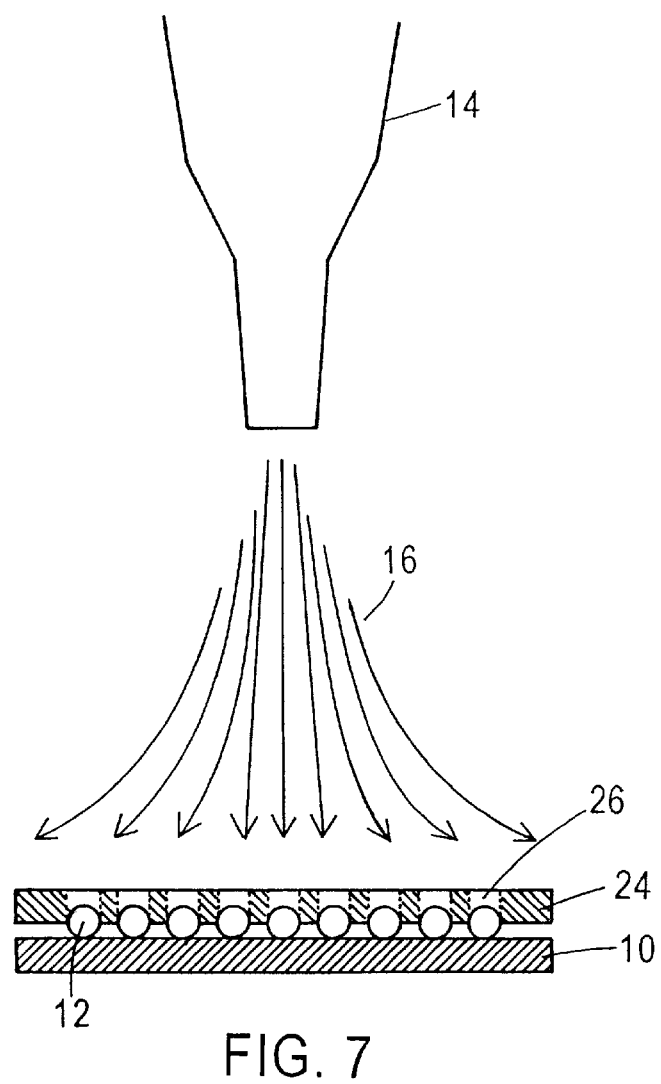
FIG. 7 depicts a method of selectively depositing flux on the plurality of flip-chip bumps, in which flux is jet sprayed on the semiconductor chip through a plurality of holes of the flux stamps.

As shown in FIG. 7, the flux stamp 24 having a plurality of flux holes 26 is mounted on the semiconductor chip 10 having a plurality of flip-chip bumps 12 on its surface. Since the flux stamp is already prepared in the manner that the plurality of flux holes 26 are arranged in a pattern substantially identically corresponding to the arrangement of the flip-chip bumps 12, the mounted flux stamp 24 selectively exposes upper surfaces of the flip-chip bumps 12 and covers portions of the chip surface between the flip-chip bumps 12. Utilizing the flux stamp 24 as a mask, flux 16 is deposited on the flip-chip bumps by jet sprayer 14, as shown in FIG. 7, or by manually brushing flux on the flux stamp 24. Since the flux stamp 24 selectively exposes the upper surfaces of the flip-chip bumps 12 and do not expose the surface of the semiconductor chip 10, flux 16 sprayed from the jet spray 14 is selectively deposited on the upper surface of the flip-chip bumps 12, and substantially no flux is deposited on the surface of the semiconductor chip 10.

Figure 8:
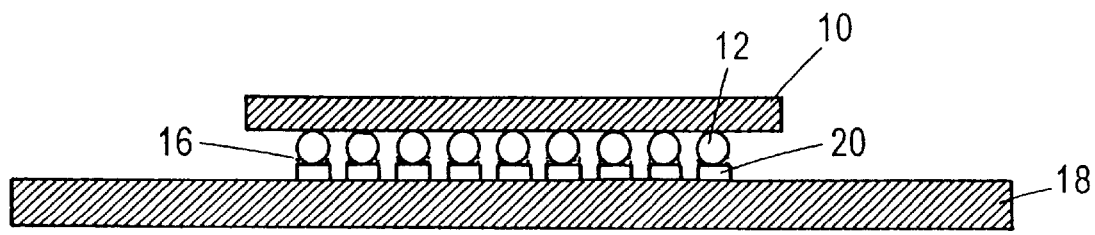
FIG. 8 depicts a cross-sectional view of a flip-chip interconnection between a semiconductor chip and a substrate, in accordance with an embodiment of the present invention, in which no flux residue remains on the surface of the chip and the substrate.

FIG. 8 depicts the semiconductor chip 10 mounted on a substrate 18 after selectively depositing flux 16 on the upper surfaces of the flip-chip bumps 12. The semiconductor chip 10 is aligned to the substrate 18 so that the flip-chip bumps 12 of the semiconductor chip 10 is directly over the flip-chip pads 20 of the substrate 18. Subsequently, the flip-chip bumps 12 are tacked in the presence of the flux 16 to the substrate 18 and reflowed to create an electrical and mechanical connection from the chip 10 to the substrate 18.

Accordingly, the present invention enables the selective deposition of flux on individual flip-chip bumps by employing a flux stamp having a plurality of flux holes arranged in a pattern substantially identical to the arrangement of the flip-chip bumps of a semiconductor chip. Since no flux is deposited on the chip surface between the flip-chip bumps, the present invention significantly reduces problems caused by flux residue, i.e., the device's functional failure during long term use, and risk on C4 fatigue life and C4 reliability during production on-off cycles. Also the present invention reduces manufacturing cost and time because no subsequent processes for cleaning flux residue are required and flux is not wasted on the chip surface.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for depositing flux on a semiconductor chip having a plurality of flip-chip bumps on its surface, the method comprising the steps of:

masking the semiconductor chip to selectively expose the plurality of flip-chip bumps; and selectively depositing flux on the plurality of flip-chip bumps.

2. The method of claim 1, wherein the step of masking the semiconductor chip comprises the step of positioning a flux stamp on the surface of the semiconductor chip, said flux stamp having a plurality of flux holes arranged so as to selectively expose the plurality of flip-chip bumps.

3. The method of claim 2, further comprising the steps of:

determining the arrangement pattern of the plurality of flip-chip bumps;

preparing the flux stamp having the plurality of flux holes arranged in a flux pattern substantially identically corresponding to an arrangement pattern of the plurality of the flip-chip bumps; and positioning the flux stamp on the surface of the semiconductor chip.

4. The method of claim 3, wherein the step of preparing the flux stamp further comprises the step of punching the flux stamp to make the plurality of flux holes.

5. The method of claim 2, wherein the step of depositing flux further comprises the step of jet spraying flux on the plurality of flip-chip bumps through the plurality of flux holes of the flux stamp.

6. The method of claim 2, wherein the step of depositing flux further comprises the step of brushing flux on the plurality of chip-chip bumps though the plurality of flux holes of the flux stamp.

7. An apparatus for depositing flux on a semiconductor chip having a plurality of flip-chip bumps on its surface, the apparatus comprising:

a flux stamp masking the surface of the semiconductor chip to selectively expose the plurality of flip-chip bumps; and a fluxer depositing flux on the exposed plurality of flip-chip bumps.

8. The apparatus of claim 7, wherein the flux stamp includes a plurality of flux holes arranged in a pattern identically corresponding to an arrangement pattern of the plurality of flip-chip bumps.

9. The apparatus of claim 8, wherein the fluxer is a jet sprayer.

10. The apparatus of claim 8, wherein the fluxer is a brush.

* * * * *